United States Patent [19]

Kawakami et al.

[11] Patent Number: 5,234,745
[45] Date of Patent: Aug. 10, 1993

[54] METHOD OF FORMING AN INSULATING LAYER ON A PRINTED CIRCUIT BOARD

[75] Inventors: Shin Kawakami; Satoshi Haruyama; Hirotaka Okonogi, all of Iruma, Japan

[73] Assignee: Nippon CMK Corp., Japan

[21] Appl. No.: 606,553

[22] Filed: Oct. 31, 1990

[30] Foreign Application Priority Data

Dec. 26, 1989 [JP] Japan .................. 1-337196

[51] Int. Cl.⁵ .............................................. C23C 26/00
[52] U.S. Cl. ...................... 428/209; 427/96; 428/901; 430/315
[58] Field of Search .................. 427/96; 428/626, 901, 428/209; 430/315

[56] References Cited

U.S. PATENT DOCUMENTS

| | | | |
|---|---|---|---|
| 4,045,636 | 8/1977 | Yoder | 428/901 |
| 4,336,320 | 6/1982 | Cummings | 427/96 |
| 4,737,446 | 4/1988 | Cohen | 427/96 |
| 4,983,252 | 1/1991 | Masui | 427/96 |
| 5,045,975 | 9/1991 | Cray | 428/901 |
| 5,055,164 | 10/1991 | Hawkins | 427/96 |
| 5,078,831 | 1/1992 | Miyazaki | 427/96 |

FOREIGN PATENT DOCUMENTS

| | | | |
|---|---|---|---|
| 659615 | 3/1963 | Canada | 427/96 |
| 1-9795 | 1/1989 | Japan | 427/96 |

Primary Examiner—Michael Lusigan
Assistant Examiner—Vi. Duong Dang
Attorney, Agent, or Firm—Bruce L. Adams; Van C. Wilks

[57] ABSTRACT

A method of forming an insulating layer on a printed circuit board for use in a manufacture of the printed circuit board is disclosed. The method comprises steps of providing a base material plate for the printed circuit board, forming a circuit pattern on the base material plate, providing an insulating layer on the circuit pattern, providing a conducting circuit on the insulating layer, and forming the insulating layer by a dry film.

6 Claims, 1 Drawing Sheet

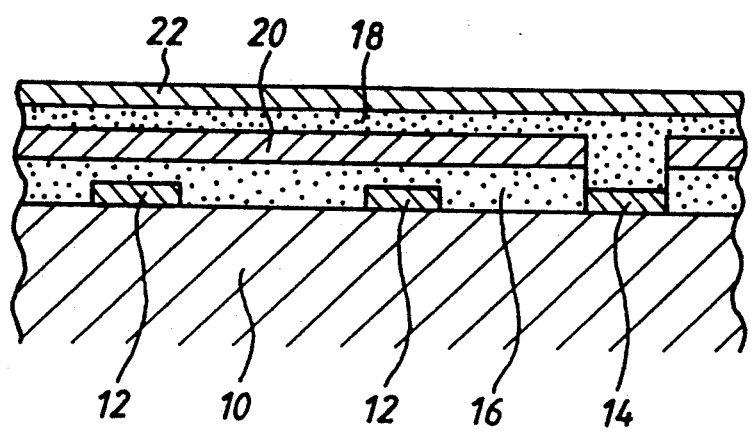

METHOD OF FORMING AN INSULATING LAYER ON A PRINTED CIRCUIT BOARD

BACKGROUND OF THE INVENTION

The present invention relates to a method of forming an insulating layer on a multi-layer printed circuit board and a printed circuit board having such an insulating layer.

In a method of manufacturing the multi-layer printed circuit board, a silk screen printing is performed on a circuit pattern with an insulating ink, and a conductive ink, for example, a carbon ink, a silver paste ink or the like is provided on the insulating ink by the silk screen printing method, thereby forming a jumper wire.

In this case, it is important to perform provides an insulation between the circuit pattern and the jumper wire which are formed on the insulating base material plate. In the case of a circuit pattern having density and complicated shape, however, it is difficult using screen printing to introduce the insulating ink between the circuit patterns and a problem formation of pin-hole arises, so that provision of an insulation between the conductive layers can not be completely performed. Therefore, a problem of the reliability in formation of film arises.

SUMMARY OF THE INVENTION

It is an object of the present invention to eliminate the above disadvantage of the conventional printed circuit board and to solve the above problems.

It is another object of the present invention to provide a method of forming an insulating layer on a printed circuit board with excellent reliability.

According to the present invention, there is provided a method of forming an insulating layer on a printed circuit board comprising the steps of providing a base material plate for the printed circuit board, forming a circuit pattern on the base material plate, providing an insulating layer on the circuit pattern, and providing a conducting circuit on the insulating layer, wherein the insulating layer is formed by a dry film.

According to the present invention, also, there is provided a printed circuit board which comprises an insulating base material plate, circuit patterns formed on the base material plate, an insulating layer formed on the circuit patterns, a conducting circuit formed on the insulating layer, and an insulating film provided between the conducting circuit and the circuit patterns. The conducting circuit comprises a jumper line and the insulating film is composed of a dry film resist.

According to the above construction of the printed circuit board, the thickness of the dry film resist may optionally be determined and no problem of pin-hole formation arises, so that the insulating layer may be obtained with high reliability.

BRIEF DESCRIPTION OF THE DRAWINGS

Other objects and advantages will be apparent from the ensuing specification and drawings in which the single Figure is a partially enlarged sectional view showing one embodiment of a printed circuit board manufactured by using a method of forming an insulating layer according to the present invention.

DETAILED EXPLANATION OF THE PREFERRED EMBODIMENT

Referring now to the drawing, there is shown a method of forming an insulating layer on a printed circuit board according to the present invention.

The single FIGURE shows an embodiment of a printed circuit board according to the present invention.

Circuit patterns 12 and 14 are provided on an insulating base material plate 10 and a solder resist film 16 is provided on the circuit patterns 12 and 14 as well as the insulating base material board with the use of a silk screen printing process. According to the present invention, a dry film 20 is thermally bonded on the solder resist film 16 in a range where a jumper wire or line 18 to be formed, and then a film for forming the jumper wire 18 is provided on the film 20 with the use of the screen printing process, thereby connecting it to the required circuit pattern 14. Finally, an over-coating layer 22 is provided on the whole surface of the thus formed printed circuit board with the use of screen printing process.

The method of forming the insulating film, that is, the dry film resist on the printed circuit board, is as follows.

At first, a sheet of a photo-setting film is thermally bonded onto the circuit patterns 12 and 14 as well as the solder resist film 16 of the printed circuit board. Then, the photo-setting film is exposed with radiation, for example ultra-violet light with a required mask, thereby curing predetermined desired portions of the photo-setting film. In this case, unnecessary portions of the photo-setting film, that is, the contacting portion of the jumper wire 18 and the portion under which the jumper wire 18 is not provided, are covered with a desired mask. After exposure of the ultra-violet light the whole surface of the printed circuit board is rinsed in a solvent to remove the unnecessary portions thereof and to leave in tact a required film layer 20.

As described above, according to the present invention, during manufacture of the multi-layer printed circuit board, the troublesome conducting inspection may be omitted and no faulty printed circuit board arises thereby resulting in a large contribution in quality control.

What is claimed is:

1. A method of forming a multi-layer printed circuit board, comprising the steps of:
   providing a base plate composed of insulating material;
   forming a plurality of spaced-apart circuit patterns on the base plate;
   forming an insulating layer over the circuit patterns;
   applying a photo-setting insulating film comprised of a dry film resist over the insulating layer;
   exposing predetermined desired portions of the photo-setting film to radiation through a mask while preventing exposure of other portions of the photo-setting film;
   removing the unexposed other portions of the photo-setting film to expose at least one of the circuit patterns while retaining intact the exposed desired portions of the photo-setting film including a desired portion which extends over some of the circuit patterns; and
   forming a conductive circuit on the photo-setting film and on the at least one exposed circuit patterns.

2. A method according to claim 1; wherein the applying step comprises thermally bonding the dry film resist onto the insulating layer.

3. A method according to claim 1; wherein the step of forming a conductive circuit comprises forming a conductive jumper line which extends over the photo-setting film and which electrically connects with at least one exposed circuit pattern.

4. A multi-layer printed circuit board formed by the method of claim 1.

5. A printed circuit board comprising: an insulating base plate; plural circuit patterns formed on the base plate; an insulating layer disposed over some but not all of the circuit patterns thereby leaving some of the circuit patterns exposed; a dry film insulating resist disposed over the insulating layer but not over the exposed circuit patterns; and a conductive circuit formed on the dry film insulating resist and on the exposed circuit patterns to define a jumper line electrically interconnecting at least two of the exposed circuit patterns.

6. A printed circuit board according to claim 5; including an over-coating layer formed over the conductive circuit and dry film insulating resist.

* * * * *